United States Patent
Yang et al.

(10) Patent No.: US 10,451,681 B2
(45) Date of Patent: Oct. 22, 2019

(54) METHOD AND APPARATUS FOR TESTING BATTERY CONDITIONS

(71) Applicant: EMC IP Holding Company LLC, Hopkinton, MA (US)

(72) Inventors: Tao Yang, Shanghai (CN); Jing Chen, Epping (AU); Jesse Xizhi Cui, Shanghai (CN); James Zhenyu Song, Shanghai (CN); Wayne Wei Zheng, Shanghai (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 15/461,701

(22) Filed: Mar. 17, 2017

(65) Prior Publication Data

US 2017/0269163 A1    Sep. 21, 2017

(30) Foreign Application Priority Data

Mar. 17, 2016  (CN) .......................... 2016 1 0154141

(51) Int. Cl.
*G01R 31/385*   (2019.01)
*H02J 7/00*     (2006.01)
*G01R 19/165*   (2006.01)

(52) U.S. Cl.
CPC .......... *G01R 31/385* (2019.01); *H02J 7/0047* (2013.01); *H02J 7/0063* (2013.01); *G01R 19/1659* (2013.01); *H02J 2007/0067* (2013.01)

(58) Field of Classification Search
CPC ....... G01R 31/3627–3641; G01R 31/385–388; H02J 7/0063–0065; H02J 2007/0067
USPC ................................. 324/427, 434
See application file for complete search history.

(56) References Cited

U.S. PATENT DOCUMENTS

| 6,259,254 B1* | 7/2001 | Klang ................ G01R 31/3631 324/427 |
| 2006/0017444 A1* | 1/2006 | Fechalos ............ G01R 31/3662 324/433 |
| 2012/0126820 A1* | 5/2012 | Tan ..................... G01R 31/3631 324/434 |

FOREIGN PATENT DOCUMENTS

CN          202330667 U      7/2012

OTHER PUBLICATIONS

First Office Action issued in related CN Application No. 201610154141.8 dated Mar. 4, 2019.

* cited by examiner

*Primary Examiner* — David V Henze-Gongola
(74) *Attorney, Agent, or Firm* — Brian J. Colandreo; Mark H. Whittenberger; Holland & Knight LLP (57) ABSTRACT

Embodiments of the present disclosure provide a method and apparatus for testing a condition of a battery. In one embodiment, a testing instruction for the battery is received from a controller of a device. In response to reception of the instruction, the battery is caused in a testing mode in which the battery and a power supply of the device concurrently provide power to the device, a first voltage provided by the battery being greater than a second voltage provided by the power supply. A condition of the battery is determined by monitoring an output current of the battery. Through the method and apparatus of the embodiments of the present disclosure, consumption for battery test may be reduced without a need of interrupting operations of the apparatus.

15 Claims, 5 Drawing Sheets

METHOD AND APPARATUS FOR TESTING BATTERY CONDITIONS

RELATED APPLICATIONS

This application claim priority from Chinese Patent Application Number CN201610154141.8, filed on Mar. 17, 2016 at the State Intellectual Property Office, China, titled "DEVICE AND METHOD FOR TESTING CONDITION OF A BATTERY," the contents of which is herein incorporated by reference in its entirety.

FIELD

Embodiments of the present disclosure generally relate to testing technologies, and more particularly, to a method and apparatus for testing battery conditions.

BACKGROUND

Batteries are always used as backup power supply means in electronic devices such as a data storage device. For data storage devices, data security is particularly important. Therefore, in the case of power off, a battery has to provide sufficient power to at least store data into a non-volatile memory or hard disk. It is possible for the battery to fall or to have an insufficient power. Therefore, electronic devices such as a data storage device need to periodically test batteries to obtain information such as whether the batteries have a failure and whether the power is sufficient.

SUMMARY

Generally, exemplary embodiments of the present disclosure provide a method and apparatus for testing battery conditions.

According to a first aspect, there is provided a method for testing a battery of a device, comprising: receiving a testing command for the battery; in response to receiving the testing command, causing the battery to enter into a testing mode in which the battery and a power supply of the device concurrently provide power to the device, a first voltage provided by the battery being greater than a second voltage provided by the power supply; and determining a condition of the battery by monitoring current outputted by the battery.

In some embodiments, the determining a condition of the battery comprises: in response to determining that the current is in a range limited by a lower-limit threshold current and an upper-limit threshold current, monitoring the current for a predetermined time period; in response to maintaining the current in the range during the predetermined time period, determining that the battery is in a normal state; and in response to the current filling below the range during the predetermined time period, determining that the battery is in a fault state.

In some embodiments, the determining a condition of the battery further comprises: in response to the current being above the upper-limit threshold current, ajusting the current to be in the range by lowering the first voltage above the second voltage.

In some embodiments, the determining a condition of the battery further comprises: in response to the current being lower than the lower limit-threshold current, adjusting the current to be in the range by raising the first voltage.

In some embodiments, the determining a condition of the battery further comprises: determining that the battery is in a fault state in response to the raised first voltage exceeding the first threshold voltage while the current being still lower than the lower-limit threshold current.

In some embodiments, the second voltage provided by the power supply is monitored; and in response to the second voltage being below the second threshold voltage, the battery is caused to switch from the testing mode to the working mode so as to supply power to the device.

In some embodiment, an indication of the state of the battery is transmitted to a controller of the device.

In some embodiments, in response to receiving the command, current battery energy of the battery is detected; and in response to the current battery energy of the battery being greater than a threshold electric energy, the battery is caused to enter into the test mode.

According to a second aspect, there is provided an apparatus for testing a condition of a battery, comprising: a controller; and a battery manager that is communicatively coupled to the battery and configured to: receive a testing command for the battery; in response to receiving the testing command, cause the battery to enter into a testing mode in which the battery and a power supply of the device concurrently provide power to the device, a first voltage provided by the battery being greater than a second voltage provided by the power supply; and determine a condition of the battery by monitoring current outputted by the battery.

According to a third aspect, there is provided a battery manager, comprising: a communication module configured to receive a testing command for the battery; a battery controlling module configured to in response to receiving the testing command, cause the battery to enter into a testing mode in which the battery and a power supply of the device concurrently provide power to the device, a first voltage provided by the battery being greater than a second voltage provided by the power supply; and a battery condition determining module configured to determine a condition of the battery by monitoring current outputted by the battery.

According to a fourth aspect, there is provided a computer program product, the computer program product being tangibly stored on a non-transient computer readable medium and including a machine executable command, the machine executable command, when being executed, causes the machine to execute the steps of the above method.

It will be appreciated that this section is not intended to identify key or important features of the embodiments of the present disclosure, not intended to limit the scope of the present disclosure. Other features of the present disclosure will be easily understood through the depiction below.

BRIEF DESCRIPTION OF THE DRAWINGS

Through the following detailed description with reference to the accompanying drawings, the above and other objectives, features, and advantages of the present disclosure will become more apparent, in which.

DETAILED DESCRIPTION OF EMBODIMENTS

Principles of this disclosure will no be described with reference, to various example embodiments. It should be appreciated that description of those embodiments is merely to enable those skilled in the art to better understand and further implement example embodiments disclosed herein and is not intended for limiting the scope disclosed herein in any manner. The content of the present disclosure as described here may be implemented in various manners other than what will be described hereinafter.

As used herein, the term "includes" and its variants are to be interpreted as open-ended terms that mean "includes, but is not limited to." The term "based on" is to be interpreted as "based at least in part on." The term "one embodiment" may be interpreted as "at least one embodiment." The term "another embodiment" may be interpreted as "at least one other embodiment."

Figure 1:
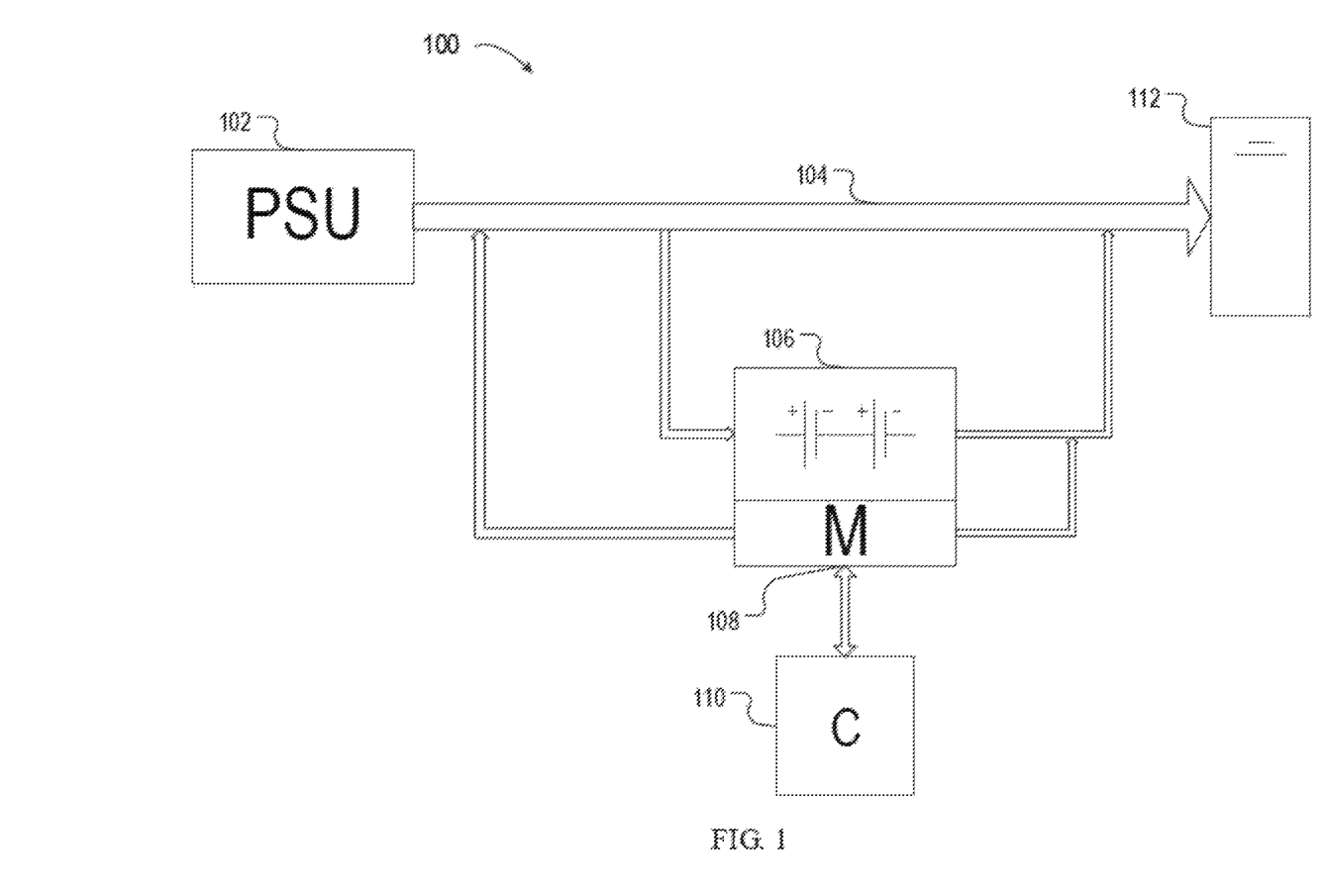
FIG. 1 illustrates a simplified block diagram of an electronic device in which embodiments of the present disclosure may be implemented.

As mentioned above, a large amount of electronic devices may be driven by batteries when necessary. FIG. 1 illustrates a simplified block diagram of an electronic device 100 in which some embodiments of the present disclosure may be implemented. The electronic device 100 may be a device of any type such as a data storage server, a personal computer (PC), and a communication server and the like. As shown in the figure, the electronic device 100 comprises a power supply unit (PSU) 102, a bus 104, a power consumption device 112, a controller 110, a battery 106, and a battery manager 108.

In a working mode, the PSU 102 provides power to a power consumption device 112 via the bus 104. When the battery 106 does not discharge, the PSU 102 also charges the battery 106 via the bus 104. The power consumption device 112 for example may be a component that needs power to work, such as a processor, a memory, and an external device. The battery manager 108 may be communicatively coupled to the processor 110 to receive commands from the processor 110, such as a testing command executed for the battery 106. The battery manage 108 manages the battery according to the command from the controller 110, such as controlling the output voltage of the battery 106, monitoring the output current of the battery 106, and monitoring the output voltage of the PSU, etc.

A general practice for a traditional battery testing method is powering off the PSU 102. Before power off of the PSU 102, data in the data storage device may be stored in advance so as to avoid data loss. After power off of the PSU 102, the battery 106 independently provides power to the power consumption device 112. In order to implement independent power supply to the power consumption device 112, the battery 106 needs to supply such as a current of about 30 A at a voltage 12V. This will significantly consume power of the battery. When the PSU 102 is power up, a longer time needs to be taken to charge the battery 106. If the PSU 102 is abruptly power off during the charging process, the battery 106 possibly has no sufficient power to be provided to the power consumption device 112. This will cause a risk of data loss. Besides, because the data storage device has to interrupt a normal work to enter into an offline test mode, a great inconvenience will be caused.

Some embodiments of the present disclosure provide a new method and apparatus for online testing a battery condition to overcome such risk and inconvenience. Generally speaking, some embodiments of the present disclosure relate to a method and apparatus for testing a condition of a battery in an electronic device such as a data storage server. While being powered by a power supply of the electronic device, the electronic device is also powered by the battery with a voltage slightly higher than the power supply voltage, and an output voltage and current of the battery is monitored for a period of time to determine the condition of the battery. In this way, a test on the battery condition can be implemented by consuming small amount of battery power, thereby saving power consumption for battery testing.

Figure 2:
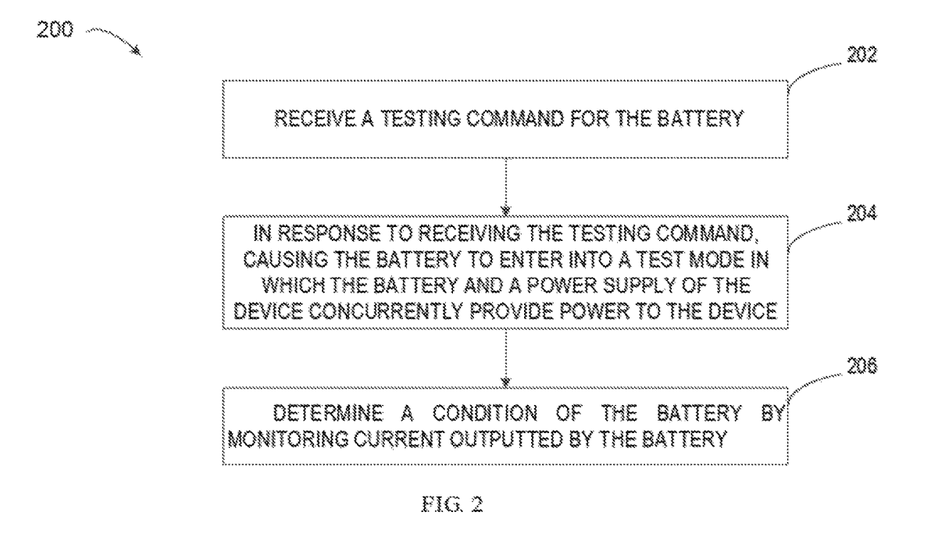
FIG. 2 illustrates a flow chart of a method for battery testing according to embodiments of the present disclosure.

FIG. 2 illustrates a flow chart of a method for battery testing according to embodiments of the present disclosure. In some embodiments, the method 200 may be implemented for example by a battery manager 108 in FIG. 1. As mentioned above, during an online testing process of the embodiments of the present disclosure, the PSU 102 is not powered off. The PSU 102 for example still provides power to the bus 104 at a 12V output voltage for use by the power consumption device 112. Before testing the battery 106, the PSU 102 constantly charges the battery 106 through the bus 104.

Specifically, in step 202, the battery manager 108 receives a test command for the battery 106. The command for example is issued by the controller 110. Alternatively, in some other embodiments, the test command may also be issued by other device independent of the electronic device 100. In response to the battery test command, in step 204, the battery manager 108 causes the battery 106 to enter into a test mode. In the context of the present disclosure, the "testing mode" is a mode in which the battery 106 and the power supply PSU 102 simultaneously provide power to the device. In contrast, the mode in which the battery 106 independently provides power to the device is referred to as "a work mode" or "a conventional mode." Particularly, in some embodiments, other relevant factors may also be considered for whether the battery 106 is switched to the test mode, which will be described hereinafter.

Once entering into the test mode, the battery 106 will provide power to the device 100 at a voltage higher than PSU 102. For the convenience of discussion, the voltage supplied by the battery 106 is referred to as "a first voltage," while the voltage supplied by the PSU 102 is referred to as "a second voltage" herein. According to the embodiments of the present invention, in the test mode, the battery manager 108 guarantees that the first voltage is higher than a second voltage.

Afterwards, in step 206, the battery manager 108 may determine a condition of the battery 106 by monitoring an output current provided by the battery 106. Generally, if the battery 106 can stably provide current in a given range during a given time period, it may be believed that the battery 106 is in a normal state. Otherwise, it may be determined that the battery 106 is in a fault state. An example embodiment of determining a battery condition will be described in detail below with reference to FIG. 3.

Figure 3:
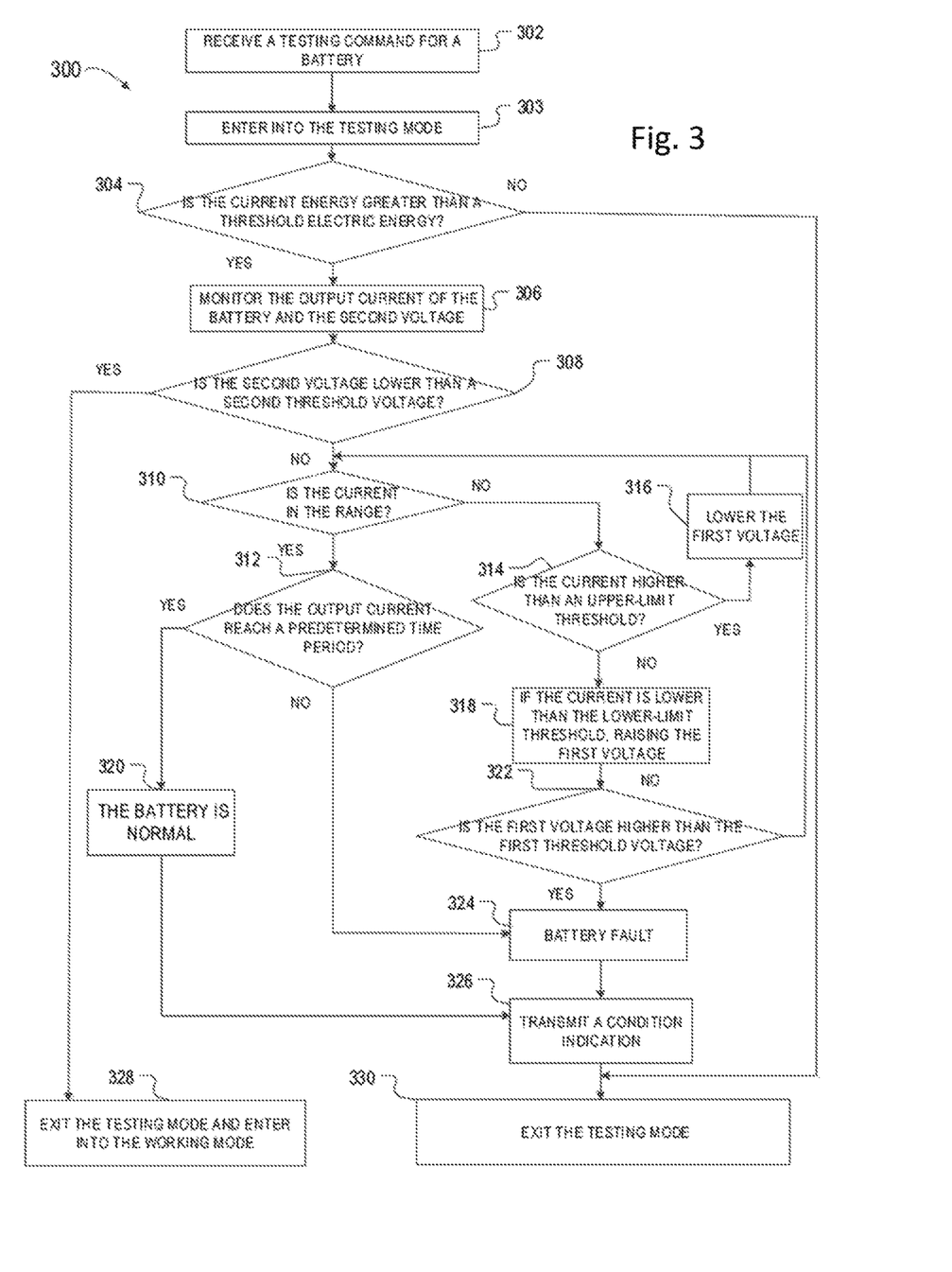
FIG. 3 illustrates a flow chart of a method for determining a battery condition through current monitoring according to embodiments of the present disclosure.

FIG. 3 illustrates a flow chart, of a method 300 for determining a battery condition through current monitoring according to embodiments of the present disclosure. In step 302, the battery manager 108 for example receives a testing command for the battery 106. After the battery manager 108 receives a testing command, in step 303, the battery manager 108 causes the battery 106 to enter into a testing mode. Steps 302 and 303 are similar to steps 202 and 2114 in the method 200 described above, respectively, which will not be detailed here.

In order to perform test, the battery 106 usually has a power (a threshold power) sufficient for testing. Therefore, in certain embodiments, in step 304, after receiving the testing command for the battery 106, the battery manager 108 detects whether the current energy of the battery 106 is greater than a threshold electric energy. If the battery manager 108 determines that the current energy of the battery 106 is less than the threshold electric energy, in step 330 the battery manager 108 causes the battery 106 to exit the testing mode. The battery 106 is continuously charged by the PSU 102 to wait for next testing. If the battery 106 has a current energy greater than the threshold electric energy, in step 306, the battery manager 108 causes the battery to enter into a discharging state, and monitors the output current of the battery 106 and the output voltage (second voltage) of the PSU 102. It should be understood that entry into the testing mode is not necessarily dependent on the energy of the battery 106. In some embodiments, the battery manager 108 may respond to a testing order to directly control the battery 106 to enter into the testing mode.

In the testing mode, as mentioned above, the battery manager 108 causes the battery 106 to output a first voltage higher than the second voltage. In some embodiments, the first voltage is initially only slightly higher than the second voltage. As an example, if the second voltage is 12V the first voltage may be 12.3V When the first voltage outputted by the battery 106 is slightly higher than the second voltage, the battery 106 may share a portion of the current which is independently provided to the PSU 102. For example, when the PSU 102 is independently powered, it outputs a current of 30 A at a voltage of 12V. When the battery 106 outputs a voltage of 12.3V, the battery 106 may provide a current of for example 3 A. At this time, the PSU 102 only needs to supply a current of 27 A.

It may be understood that because the power consumed by normal operation of the power consumption device 112 in the testing mode is mostly from the PSU 102, in certain embodiments, an output voltage of the PSU 102 may be monitored to prevent its abrupt power oft or occurrence of fault from causing dramatic drop of the voltage. To this end, in some embodiments, the battery manager 108 may determine in step 308 whether the second voltage is lower than a threshold voltage (which is referred to as "second threshold voltage" at the ease of discussion). If the second voltage outputted by the PSU 102 is lower than the second threshold voltage, then the method 300 proceeds to step 328 in which the battery manager 108 here causes the battery 106 to switch from the testing mode to a working mode. In the working mode, the battery 106 independently supplies power to the power consumption device 1102. For example, the battery 106 outputs a current of 30 A at an output voltage of 12V. It will be appreciated that during the whole period of the testing for the battery 106, the output voltage of the PSU 102 needs to be monitored. Once the output voltage of the PSU 102 is lower than the second threshold voltage, the battery 106 exits from the testing mode and enters into the working mode.

If it is determined in step 308 that the second voltage is equal to or higher than the second threshold voltage, the method 300 proceeds to step 310. In step 310, the battery manager 108 determines that the output current of the battery 106 is in a given range limited by the lower-limit threshold current and upper-limit threshold current. For testing of the battery 106, it is neither desired to consume a large power of the battery 106 nor desired to detect a battery fault. Therefore, an upper-limit threshold current and a lower-limit threshold current need to be set for the two cases. As an example, in a scenario of a data storage device, the upper-limit threshold current for example may be 5 A, while the lower-limit threshold current may be 1 A.

If the output voltage of the battery 106 is in the range, then in step 312, the battery manager 108 monitors whether the battery 106 maintains in the range during a threshold time period. As an example, the predetermined time period for example may be 1 minute or any appropriate time length. It may be understood that the predetermined time period may vary with different application scenarios. If it is determined in step 312 that the output current of the battery 106 during a predetermined time period is in a range limited by the lower-limit threshold current and the upper-limit threshold current, the method proceeds to step 320, and the battery manager 108 here determines that the battery 106 is normal. In certain embodiments, in next step 326, the battery manager 108 may transmit an indication indicating normal condition of the battery to the controller 110 of the device for example. Hereinafter, in step 330, the battery manager 108 causes the battery 106 to exit the testing mode.

On the other hand, if it is determined in step 312 that the battery 106 cannot continuously output current in a predetermined range during the given time period, it may be determined in step 324 that the battery is in a fault state. In certain embodiments, the battery manager 108 may transmit a message indicating a fault state to for example the controller 110.

Returning to step 310, if it is determined here that the current outputted by the battery 106 is not in a predetermined range, the method 300 proceeds to step 314 in which the battery manager 108 determines whether the current is higher than an upper-limit threshold current. If the battery manager 108 determines that the current is larger than the upper-limit threshold current, it indicates that the – current of the battery is relatively high and thus needs to be adjusted. The battery manager 108 then causes the output voltage of the battery to drop in step 316. In certain embodiments, the battery manager 108 ensures that the first voltage after drop of the battery 106 is still higher than the second voltage of the PSU 102. For example, if it is detected that the output current of the battery 106 is 4 A, the battery manager 108 lowers the output voltage of the battery 106 for example to 12.1V (still higher than 12V of the second voltage) from 12.3V. After the output voltage of the battery 106 drops to 12.1V, the output current of the battery 106 for example may drop to 2 A from 4 A. Hereafter, the battery manager 108 returns to step 310 to determine whether 2 A outputted by the battery 106 is in the range limited by the lower-limit threshold current (e.g., 1 A) and the upper-limit threshold current (e.g., 3 A).

If it is determined in step 314 that the output current of the battery 106 is smaller than the upper-limit, threshold current, the battery manager 108 may determine that the output current is smaller than the lower-limit threshold current (because it has been determined in step 310 that the current is not in the range). At this time, in step 318, the battery manager 108 raises the first voltage of the battery 106, e.g., increases from 12.3V to 12.5V. It may be appreciated that by increasing the output voltage of the battery 106, the output current of the battery 106 may be increased.

In step 322, the battery manager 108 determines whether the first voltage of the battery 108 exceeds a threshold voltage (referred to as "first threshold voltage"). In other words, in such an embodiment, increase of the first voltage cannot be continued without limit. If the first voltage is raised to the first threshold while the battery 106 cannot provide a current exceeding the lower-limit threshold current, it may be determined that the battery 106 might have a fault. In this case, the battery 106 very possibly cannot work normally under the working mode, which therefore needs replacement or maintenance. At this point, the method 300 proceeds to step 324 in which the battery manager 108 determines that the battery 106 has a failure. Optionally, in step 326, the battery manager 108 transmits, to the controller 110, an indication of a condition that the battery 106 has a fault. Then, in step 330, the battery manager 108 causes the battery 106 to exit the testing mode.

On the other hand, if the battery manager 108 determines in step 322 that the first voltage is lower than the first threshold voltage, the method 300 may return to 310 to re-determine whether the output current of the battery 10 is in the range. Hereafter, the step above may be repeated.

It will be appreciated that although one embodiment of the method of the present disclosure is described in sequential steps of the flow chart, the method steps of the embodiment of the present disclosure is not necessarily executed according to the step sequence. Other combinations and sequences of some steps may exist. For example, it will be appreciated that the output current of the battery 106 may be monitored by the battery manager 108 in real time. The battery manager 108 might not follow a sequence of first determining whether the current is in a range, next determining whether the current is higher than the upper-limit threshold current, and then determining whether the current is lower than the lower-limit threshold current. On the contrary, according to the real-time detected current value, the battery manager 108 may dynamically adjust the output voltage of the battery 106. For example, when the battery manager 108 detects that the output current of the battery 106 is 4 A, it immediately adjusts the output voltage of the battery 106 from 12.3V to 12.1V. The battery manager 108 then detects that the output current of the battery is 1 A. The battery manager 108 then adjusts the output voltage of the batter 106 from 12.1V to 12.2V.

Figure 4:
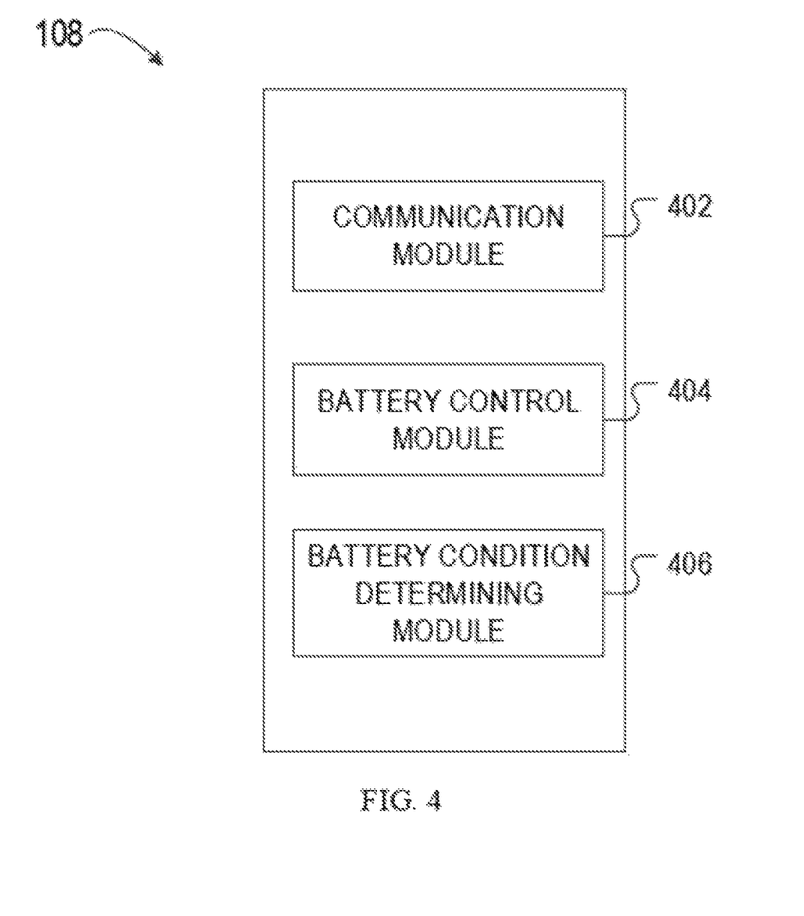
FIG. 4 illustrates a schematic block diagram of a battery manager according to embodiments of the present disclosure.

FIG. 4 illustrates a schematic block diagram of a battery manager 108 according to embodiments of the present disclosure. As illustrated in the figure, the battery manager 108 comprises a communication module 402, a battery control module 404, and a battery condition determining module 406. The communication module 402 is configured to receive a testing command for the battery 106. The battery control module 404 is configured to cause the battery 106 to enter into a testing mode in response to receiving the testing instruction. The battery 106 provides power to the device 100 concurrently with a power supply PSU 102 of the device 100 in the testing mode. A first voltage of the battery 106 is higher than a second voltage of the PSU 102. The battery condition determining module 406 determines the condition of the battery 106 by monitoring the output current of the battery 106. Features regarding the operations/functions of respective modules have been described above, which will not be detailed here.

It will be appreciated that respective modules of the battery manager 108 shown in FIG. 4 may be implemented by hardware. For example, one or more of the modules 402, 404, and 406 may be implemented as hardware modules, including, but not limited to: an integrated circuit (IC) chip, an application-specific integrated circuit (ASIC) chip, a system-on-chip (SoC), and a field programmable gate array (FPGA), etc.

Alternatively or additionally, certain or all modules of the battery manager 108 may be implemented through software. For example, in one embodiment, the battery manager 108 may be implemented as a computer program product, which may be tangibly embodied in a storage medium accessible by the device 100 and may be executed by the controller 110 in the device 100.

Figure 5:
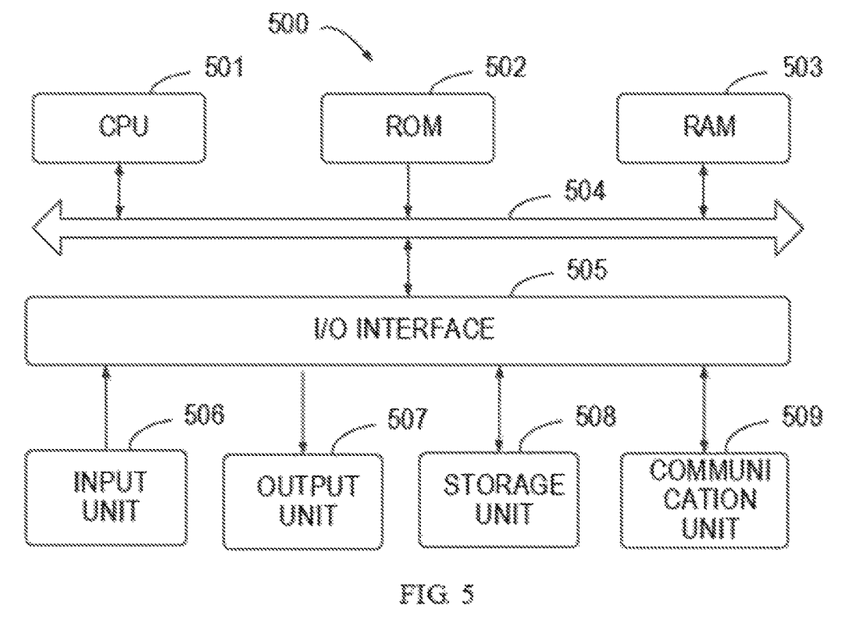
FIG. 5 illustrates a schematic block diagram of a device that may implement embodiments of the present disclosure.

FIG. 5 illustrates a schematic block diagram of a device 500 that may implement embodiments of the present disclosure. The device 500 may be one embodiment of the device 100 as described above. As shown in the figure, the device 500 comprises a central processing unit (CPU) 501, which may act as the controller 110 described above. The CPU 501 executes various kinds of appropriate actions and processing according to computer program instructions stored in the read-only memory (ROM) 502 or computer program instructions loaded from a memory unit 508 into the random access memory (RAM) 503. In RAM 503, there may also store various kinds of programs and data needed for operation of the storage device 500. The CPU501, ROM502, and RAM503 are connected with each other is bus 504. The input/output (I/O) interface 505 is also connected to the bus 504.

Connected to the I/O interface 505 are a plurality of components in the device 500, including: an input unit 506 such as a keyboard, a mouse, etc.; an output unit 507 such as various kinds of displays, a loudspeaker, etc.; a memory unit 508 such as a magnetic disk, an optical disk, etc.; and a communication unit 509 such as a network card, a modem, a radio transceiver, etc. The communication unit 509 allows the device 500 to exchange information/data with other device through a computer network such as Internet and/or various kinds of telecommunications networks.

The device 500 may also comprise a battery 106, a battery manager 108, and a PSU 102 (not shown). The battery 106 and the PSU 102 for example may be used to provide power to the CPU 501, the ROM 502, the RAM 503, the input unit 504, the memory unit 508, and the communication unit 509. The battery manager 108 may test the battery 106 for example according to a command from the CPU 501, and return a test result regarding the condition of the battery 106 via the bus 504.

Various processes and processing described above, e.g., the method 300, may be executed by the processing unit 501. For example, in some embodiments, the method 200 and/or 300 may be implemented as a computer software program that is tangibly embodied in a machine-readable medium, e.g., a storage unit 508. In some embodiments, part or all of the computer program may be loaded and/or installed on the device 500 via the ROM 502 and/or the communication unit 509. When the computer program is loaded to the RAM 503 and executed by the CPU 501, one or more steps of the method 200 and/or 300 as described above may be executed.

Generally, various embodiments of the present disclosure may be implemented by hardware, specific circuit, software, logic or any combination thereof. Some aspects may be implemented by hardware, and some other aspects may be implemented by firmware or software that may be executed by a controller, a microprocessor, or other computing device. Although various aspects of the present disclosure will be shown and described as block diagrams, flow charts or some other graphical representations; however, it may be appreciated that the blocks, devices, systems, technologies or methods described herein may be implemented in a non-limiting manner by hardware, software, firmware, specific circuit or logic, general hardware or controller or other computing device or a combination of some thereof.

Additionally, although the operations are described in a specific sequence, it will not be appreciated that these operations are required to be executed in the shown sequence or sequentially or executed to achieve a desired outcome. In some cases, the multiple task or parallel processing may be advantageous. Similarly, also details based on the preferred embodiments are included in the discussion above, these should not be construed as any limitation to the scope of the present disclosure, while description of the feature is only for specific embodiments. Some features described in some separate embodiments may also be executed in combination in a single embodiment. In turn, various features described in a single embodiment may also be separately implemented in a plurality of embodiments or implemented in any appropriate sub-combination.

Although the present disclosure is described using specific structural features and/or method actions, it may be understood that the present disclosure limited in the appended claims is not necessarily limited to the specific features or actions. The specific features and actions are only disclosed as examples for implementing the claims.

We claim:

1. A method of testing a battery of a device, comprising:
   receiving a testing command for the battery;
   in response to receiving the testing command, causing the battery to enter into a testing mode in which the battery and a power supply of the device concurrently provide power to the device, a first voltage provided by the battery being greater than a second voltage provided by the power supply and a first current provided by the battery being less than a second current provided by the power supply; and
   determining a condition of the battery by monitoring current outputted by the battery, wherein determining the condition of the battery comprises:
      determining that the first current is in a range limited by a lower-limit threshold current and an upper-limit threshold current, and
      in response to the first current being above the upper-limit threshold current, adjusting the first current to be in the range by lowering the first voltage while keeping the first voltage above the second voltage.

2. The method according to claim 1, wherein the determining a condition of the battery comprises:
   in response to determining that the current is in a range limited by a lower-limit threshold current and an upper-limit threshold current, monitoring the current for a predetermined time period;
   in response to maintaining the current in the range during the predetermined time period, determining that the battery is in a normal state; and
   in response to the current falling below the range during the predetermined time period, determining that the battery is in a fault state.

3. The method according to claim 2, wherein the determining a condition of the battery further comprises:
   in response to the current being lower than the lower-limit threshold current adjusting the current to be in the range by raising the first voltage.

4. The method according to claim 3, wherein the determining a condition of the battery further comprises:
   determining that the battery is in a fault state in response to the raised first voltage exceeding a first threshold voltage while the current being still lower than the lower-limit threshold current.

5. The method according to claim 1, further comprising:
   monitoring the second voltage provided by the power supply; and
   in response to the second voltage being below a second threshold voltage, causing the battery to switch from the testing mode to the working mode so as to supply power to the device.

6. The method according to claim 1, further comprising:
   transmitting an indication of the state of the battery to a controller of the device.

7. The method according to claim 1, wherein causing the battery to enter into a testing mode comprises:
   in response to receiving the command, detecting current battery energy of the battery; and
   in response to the current battery energy of the battery being greater than a threshold electric energy, causing the battery to enter into the test mode.

8. An electronic device, comprising:
   a battery; and
   a battery manager that is communicatively coupled to the battery and configured to:
      receive a testing command for the battery;
      in response to receiving the testing command, cause the battery to enter into a testing mode in which the battery and a power supply of the device concurrently provide power to the device, a first voltage provided by the battery being greater than a second voltage provided by the power supply and a first current provided by the battery being less than a second current provided by the power supply; and
      determine a condition of the battery by monitoring current outputted by the battery, wherein determining the condition of the battery comprises:
         determining that the first current is in a range limited by a lower-limit threshold current and an upper-limit threshold current, and
         in response to the first current being above the upper-limit threshold current, adjusting the first current to be in the range by lowering the first voltage while keeping the first voltage above the second voltage.

9. The electronic device according to claim 8, wherein the battery manager is further configured to:
   in response to determining that the current is in a range limited by a lower-limit threshold current and an upper-limit threshold current, monitor the current for a predetermined time period;
   in response to maintaining the current in the range during the predetermined time period, determine that the battery is in a normal state; and
   in response to the current falling below the range during the predetermined time period, determine that the battery is in a fault state.

10. The electronic device according to claim 9, wherein the battery manager is further configured to:
    in response to the current being lower than the lower-limit threshold current, adjust the current to be in the range by raising the first voltage.

11. The electronic device according to claim 10, wherein the battery manager is further configured to:
    determine that the battery is in a fault state in response to the raised first voltage exceeding a first threshold voltage while the current being still lower than the lower-limit threshold current.

12. The electronic device according to claim 8, wherein the battery manager is further configured to:
    monitor the second voltage provided by the power supply; and in response to the second voltage being below a second threshold voltage, cause the battery to switch from the testing mode to the working mode so as to supply power to the device.

13. The electronic device according to claim 8, wherein the battery manager is further configured to:
   transmit an indication of the state of the battery to a controller of the device.

14. The electronic device according to claim 8, wherein the battery manager is further configured to:
   detect current battery energy of the battery; and
   in response to the current battery energy being greater than a threshold electric energy, causing the battery to enter into the test mode.

15. A battery manager comprising a computer program product residing on a non-transitory computer readable storage medium having a plurality of instructions stored thereon which, when executed by a processor, cause the processor to perform operations, comprising;
   receiving a testing command for a battery;
   in response to receiving the testing command, causing the battery to enter into a testing mode in which the battery and a power supply of the device concurrently provide power to the device, a first voltage provided by the battery being larger than a second voltage provided by the power supply and a first current provided by the battery being less than a second current provided by the power supply; and
   determining a condition of the battery by monitoring current outputted by the battery, wherein determining the condition of the battery comprises:
      determining that the first current is in a range limited by a lower-limit threshold current and an upper-limit threshold current, and
      in response to the first current being above the upper-limit threshold current, adjusting the first current to be in the range by lowering the first voltage while keeping the first voltage above the second voltage.

* * * * *